(12) United States Patent
Sun et al.

(10) Patent No.: US 9,634,093 B2
(45) Date of Patent: Apr. 25, 2017

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Min-Chul Sun, Seoul (KR); Byung-Gook Park, Seoul (KR)

(73) Assignees: SAMSUNG ELECTRONICS CO., LTD., Suwon-Si, Gyeonggi-Do (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 0 days.

(21) Appl. No.: 15/151,747

(22) Filed: May 11, 2016

(65) Prior Publication Data

US 2016/0254349 A1    Sep. 1, 2016

Related U.S. Application Data

(63) Continuation of application No. 14/049,479, filed on Oct. 9, 2013, now Pat. No. 9,343,549.

(30) Foreign Application Priority Data

Oct. 10, 2012 (KR) .................. 10-2012-0112505

(51) Int. Cl.
| | |
|---|---|
| *H01L 29/66* | (2006.01) |
| *H01L 29/423* | (2006.01) |
| *H01L 29/786* | (2006.01) |
| *H01L 29/78* | (2006.01) |
| *H01L 29/06* | (2006.01) |
| *H01L 21/02* | (2006.01) |

(Continued)

(52) U.S. Cl.
CPC .... *H01L 29/0673* (2013.01); *H01L 21/02532* (2013.01); *H01L 21/308* (2013.01); *H01L 21/30604* (2013.01); *H01L 29/42392* (2013.01); *H01L 29/66545* (2013.01); *H01L 29/66742* (2013.01); *H01L 29/66795* (2013.01); *H01L 29/785* (2013.01); *H01L 29/78696* (2013.01); *H01L 29/7843* (2013.01); *H01L 29/7848* (2013.01)

(58) Field of Classification Search
CPC ............ H01L 29/66795; H01L 29/785; H01L 21/845; H01L 27/1211; H01L 29/66545; H01L 21/823431; H01L 27/0886
See application file for complete search history.

(56) References Cited

U.S. PATENT DOCUMENTS

| | | |
|---|---|---|
| 6,565,759 B1 | 5/2003 | Chen et al. |
| 7,871,909 B1 | 1/2011 | Wang et al. |

(Continued)

FOREIGN PATENT DOCUMENTS

| | | |
|---|---|---|
| JP | 2006-196617 A | 7/2006 |
| KR | 10-2001-0066291 A | 7/2001 |
| KR | 10-2007-0021431 A | 2/2007 |

*Primary Examiner* — Bac Au
(74) *Attorney, Agent, or Firm* — Lee & Morse P.C.

(57) ABSTRACT

A method for fabricating a semiconductor device includes forming a first mask on a substrate, forming a first side wall of a fin by performing a first etching of the substrate using the first mask, forming a second mask on the substrate, the second mask being different from the first mask, and forming a second side wall of the fin by performing a second etching of the substrate using the second mask.

10 Claims, 25 Drawing Sheets

(51) Int. Cl.
    *H01L 21/306*  (2006.01)
    *H01L 21/308*  (2006.01)

(56)            References Cited

U.S. PATENT DOCUMENTS

| | | |
|---|---|---|
| 8,748,940 B1 * | 6/2014 | Rachmady et al. ................. H01L 29/66409 257/190 |
| 8,941,177 B2 | 1/2015 | Adams et al. |
| 2003/0096503 A1 | 5/2003 | Cho et al. |
| 2003/0127690 A1 | 7/2003 | Bryant et al. |
| 2005/0179030 A1 | 8/2005 | Seo et al. |
| 2007/0018237 A1 | 1/2007 | Kim et al. |
| 2008/0048268 A1 | 2/2008 | Hsu et al. |
| 2008/0157206 A1 | 7/2008 | Mikasa |
| 2010/0120247 A1 | 5/2010 | Park |
| 2010/0267238 A1 | 10/2010 | Johnson et al. |
| 2012/0138886 A1 * | 6/2012 | Kuhn et al. ......... H01L 21/0676 257/9 |
| 2013/0082354 A1 | 4/2013 | Yin et al. |
| 2014/0001560 A1 | 1/2014 | Cappallani et al. |
| 2014/0131660 A1 * | 5/2014 | Cea et al. ........... H01L 29/0669 257/24 |
| 2014/0175379 A1 * | 6/2014 | Chu-Kung et al. ..... H01L 29/06 257/20 |
| 2014/0285980 A1 * | 9/2014 | Cappellani et al. ................... H01L 29/0657 361/748 |

* cited by examiner

US 9,634,093 B2

METHOD FOR FABRICATING SEMICONDUCTOR DEVICE

CROSS-REFERENCE TO RELATED APPLICATIONS

This is a continuation application based on pending application Ser. No. 14/049,479, filed Oct. 9, 2013, the entire contents of which is hereby incorporated by reference.

Korean Patent Application No. 10-2012-0112505, filed on Oct. 10, 2012, in the Korean Intellectual Property Office, and entitled: "Semiconductor Device and Method For Fabricating the Same," is incorporated by reference herein in its entirety.

BACKGROUND

1. Field

Embodiments relate to a semiconductor device and a method for fabricating the same, and more particularly, to a semiconductor device having a multi-gate and a method for fabricating the same.

2. Description of the Related Art

One of the scaling techniques to increase density of a semiconductor device includes use of a multi-gate transistor. In a multi-gate transistor, a fin-shaped or a nanowire-shaped silicon body is formed on a substrate, and a gate is formed on a surface of the silicon body.

Since such a multi-gate transistor uses a three-dimensional (3D) channel, it is easy to perform scaling. Further, current control capability can be improved even without increasing a gate length of the multi-gate transistor. In addition, a short channel effect (SCE), i.e., where an electric potential of a channel region is affected by a drain voltage, can be effectively suppressed.

SUMMARY

Embodiments provide a semiconductor device with fins having a high aspect ratio.

Embodiments provide a method for fabricating a semiconductor device with fins having a high aspect ratio.

In one aspect, example embodiments provide a method for fabricating a semiconductor device, the method including forming a first mask on a substrate, forming a first side wall of a fin by performing a first etching of the substrate using the first mask, forming a second mask on the substrate, the second mask being different from the first mask, and forming a second side wall of the fin by performing a second etching of the substrate using the second mask.

Performing the first etching of the substrate may include forming a trench in the substrate, and forming the second mask may include forming a first portion that fills the trench and forming a second portion that projects above an upper surface of the substrate.

Forming the second mask may include forming a width of the second portion wider than a width of the first portion.

Forming the second mask may include forming a side wall of the second portion in a spacer shape, a width of the spacer shape being equal to a width of the fin.

Forming the second mask may include filling the trench and forming a first insulating film that projects above an upper surface of the substrate, in a state where the first mask is formed on the substrate after forming the first side wall of the fin, removing the first mask, and forming a second insulating film in a spacer shape on a side wall of the first insulating film that projects above the upper surface of the substrate to complete the second mask.

The method may further include forming a structure on the substrate, the structure including alternately and repeatedly stacked semiconductor layers and sacrificial layers, wherein forming the first mask on the substrate includes forming the first mask on the structure, wherein performing the first etching of the substrate includes forming a first side wall of the fin, wherein forming the second mask on the substrate includes forming the second mask on the structure, and wherein performing the second etching of the substrate includes forming a second side wall of the fin by performing the second etching of the structure.

The method may further include removing the sacrificial layers of the structure, after forming the second side wall of the fin, such that a plurality of stacked and spaced apart semiconductor layers remain in the structure.

The method may further include removing the second mask, after defining the plurality of stacked and spaced apart semiconductor layers.

The semiconductor layers may include Si, and the sacrificial layers may include SiGe.

The first mask may be a nitride film, and the second mask may be an oxide film.

In another aspect, example embodiments provide a method for fabricating a semiconductor device including forming a structure on a substrate, such that the structure includes alternately and repeatedly stacked semiconductor layers and sacrificial layers, forming a first mask on the structure, forming a first side wall of a fin by performing a first etching of the structure using the first mask, forming a second mask on the structure, the second mask being different from the first mask, forming a second side wall of the fin by performing a second etching of the structure using the second mask, removing the sacrificial layers of the structure, such that a plurality of stacked semiconductor layers remains and is spaced apart from each other in the structure, and removing the second mask.

Performing the first etching of the substrate may include forming a trench in the substrate, and forming the second mask may include forming a first portion that fills the trench and forming a second portion that projects above an upper surface of the substrate.

Forming the second mask may include forming a width of the second portion wider than a width of the first portion.

Forming the second mask may include forming a side wall of the second portion in a spacer shape, a width of the spacer shape being equal to a width of the fin.

The semiconductor layer may be made of Si, and the sacrificial layer may be made of SiGe.

In another aspect, example embodiments provide a method for fabricating a semiconductor device including forming a first mask on a substrate, forming a first side wall of a fin by performing a first etching of the substrate using the first mask, forming a second mask on the substrate, the second mask covering at least one different surface than the first mask, and forming a second side wall of the fin by performing a second etching of the substrate using the second mask, the second side wall of the fin being parallel to the first side wall of the fin.

The first and second etchings may be separate and sequential processes.

Forming the second mask may include covering at least one surface exposed by the first etching.

Forming the second mask may include covering the first side wall of the fin.

Forming the second side wall of the fin may include depositing an insulating layer along the first side wall of the fin, such that the first side wall of the fin is supported during the second etching.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Advantages and features of embodiments and methods of accomplishing the same may be understood more readily by reference to the following detailed description and the accompanying drawings. Embodiments may, however, be embodied in many different forms and should not be construed as being limited to those set forth herein. Rather, these embodiments are provided so that this disclosure will be thorough and complete, and embodiments will only be defined by the appended claims. Thus, in some embodiments, well-known methods, procedures, components, and circuitry have not been described in detail to avoid unnecessarily obscuring aspects.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments will be described in detail with reference to the accompanying drawings.

Figure 12:
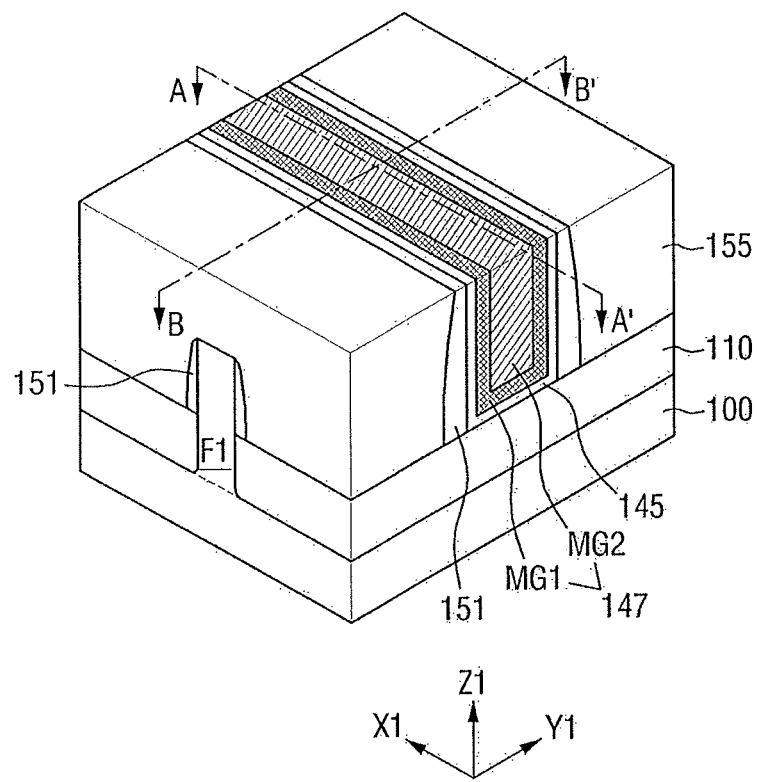
Figure 13:
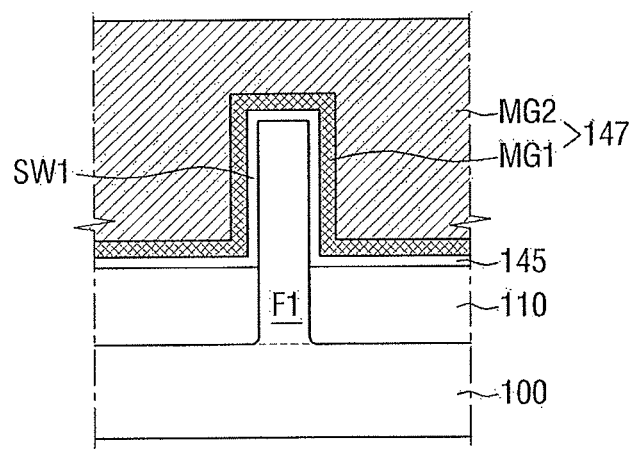
Figure 14:
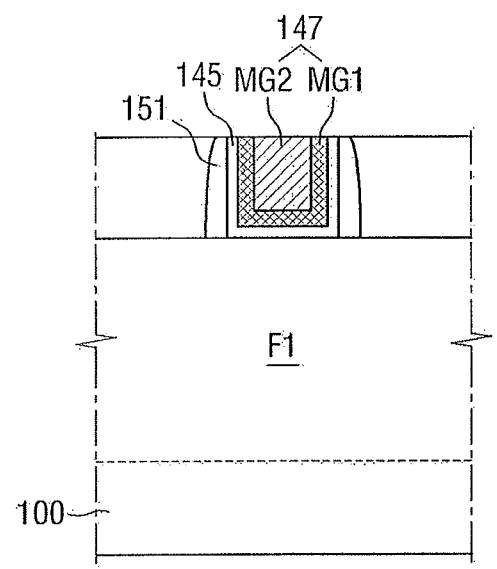
Figure 15:
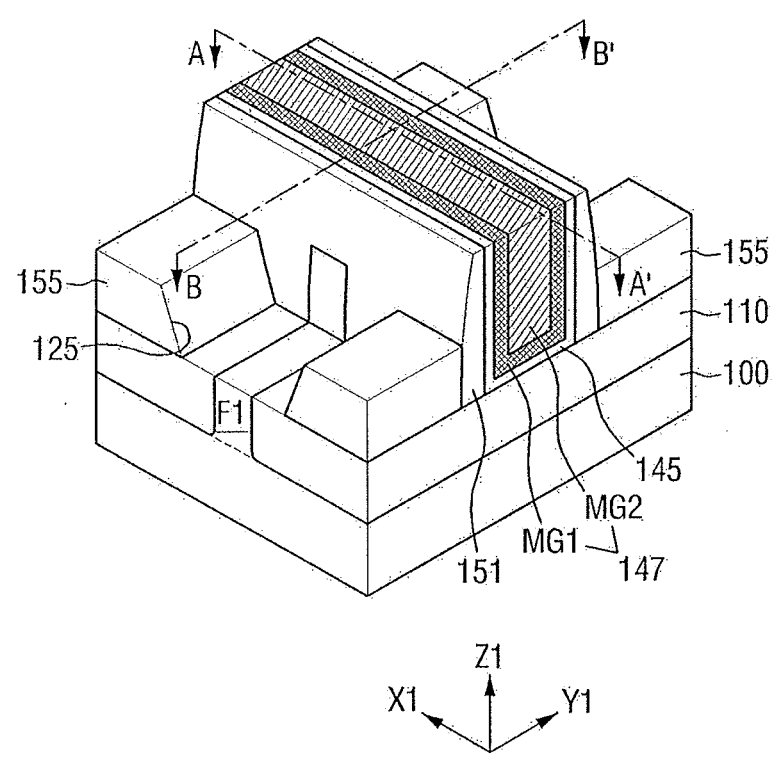
Figure 16:
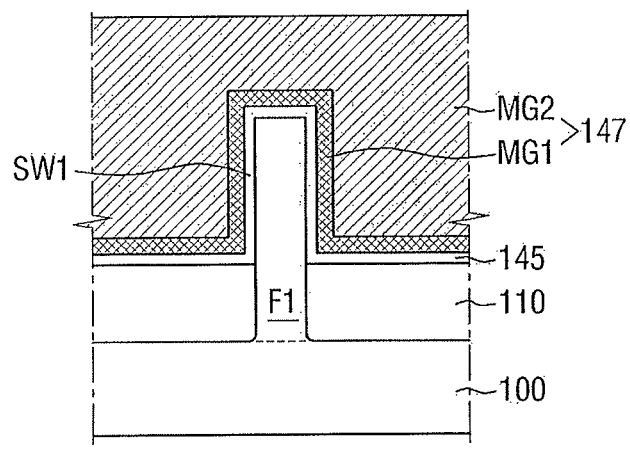
Figure 17:
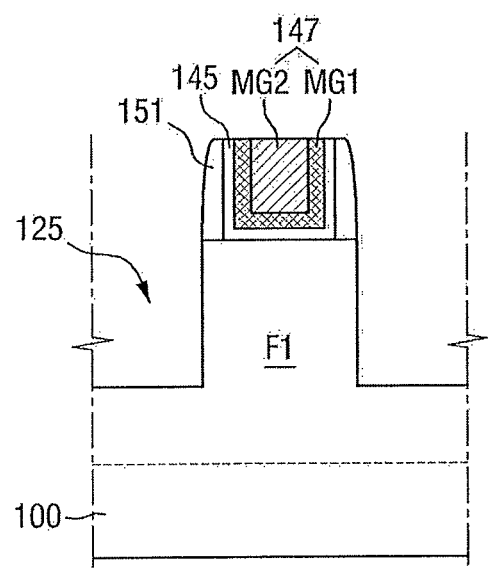
Figure 18:
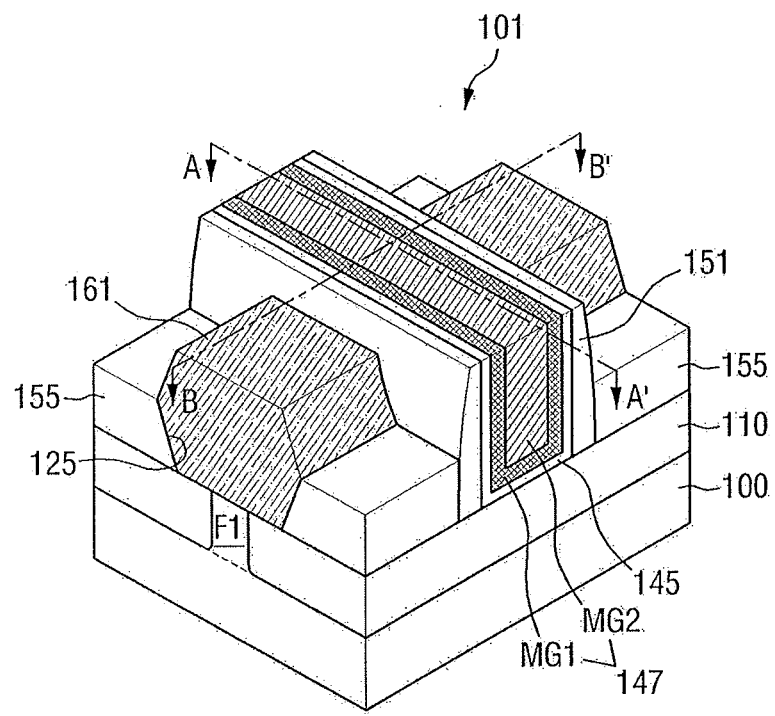
Figure 19:
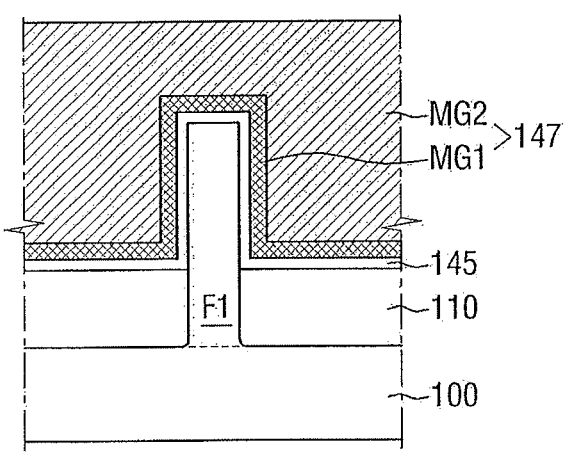
Figure 20:
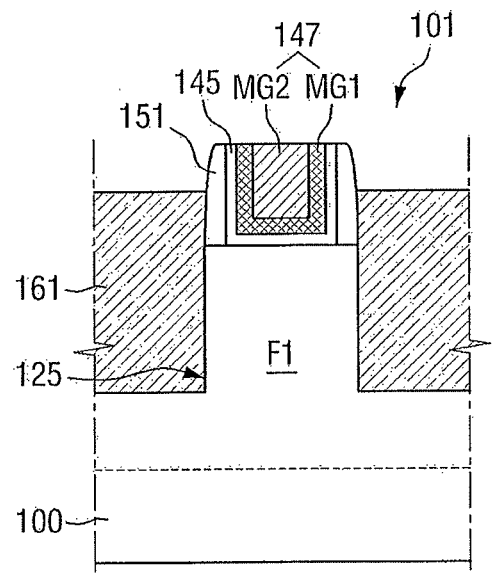

FIGS. 1 to 20 illustrate views of intermediate steps explaining a method for fabricating a semiconductor device according to an embodiment. FIG. 13 is a cross-sectional view taken along line A-A in FIG. 12, and FIG. 14 is a cross-sectional view taken along line B-B in FIG. 12. FIG. 16 is a cross-sectional view taken along line A-A in FIG. 15, and FIG. 17 is a cross-sectional view taken along line B-B in FIG. 15. FIG. 17 is a cross-sectional view taken along line B-B in FIG. 15. FIG. 19 is a cross-sectional view taken along line A-A in FIG. 18, and FIG. 20 is a cross-sectional view taken along line B-B in FIG. 18.

Figure 1:
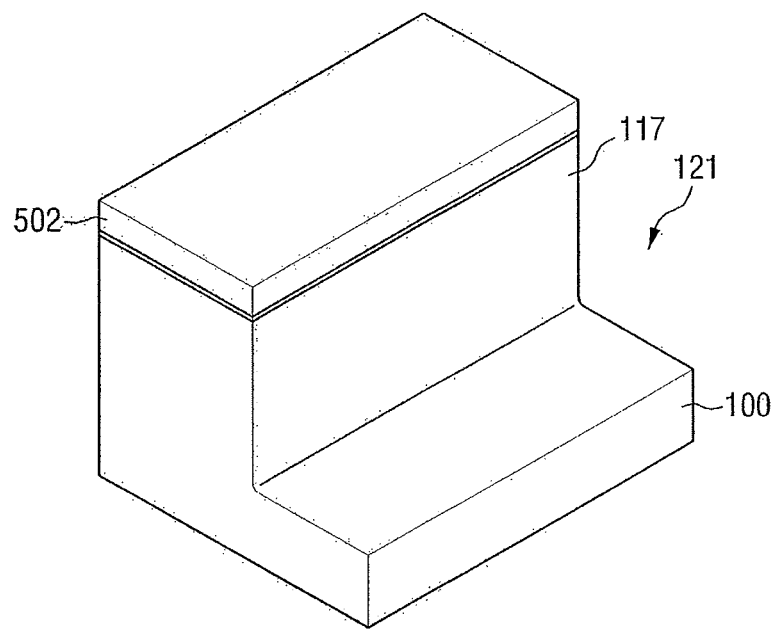
FIGS. 1 to 20 illustrate stages in a method for fabricating a semiconductor device according to an embodiment.

Referring to FIG. 1, a first mask 502 may be formed on a substrate 100. For example, the substrate 100 may be made of one or more semiconductor materials, e.g., at least one of Si, Ge, SiGe, GaP, GaAs, SiC, SiGeC, InAs, and InP. Further, the substrate 100 may be an SOI (Silicon On Insulator) substrate. Further, the substrate 100 may be provided by forming an epi-layer on a base substrate. The first mask 502 may be made of, e.g., one or more of an oxide film, a nitride film, an oxynitride film, and a metal film. In an embodiment, it is exemplified that the first mask 502 is a nitride film. The first mask 502 may have a structure in which two or more layers are stacked, but is not limited thereto.

Then, a first side wall 117 of a fin (see F1 in FIG. 4) is formed by performing first etching of the substrate 100 using the first mask 502. That is, a trench 121 may be formed in the substrate 100 by performing the first etching of the substrate 100. The first etching may be anisotropic etching, and for example, dry etching.

Figure 2:
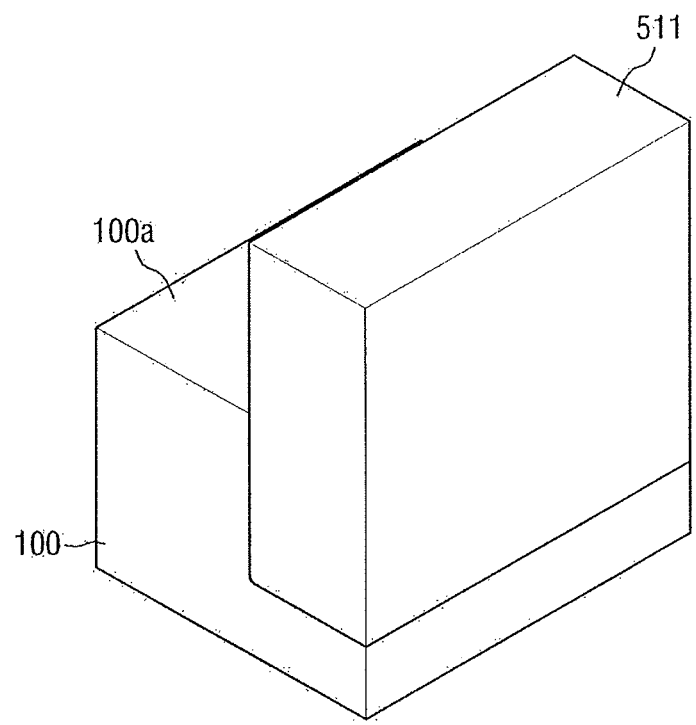
Figure 3:
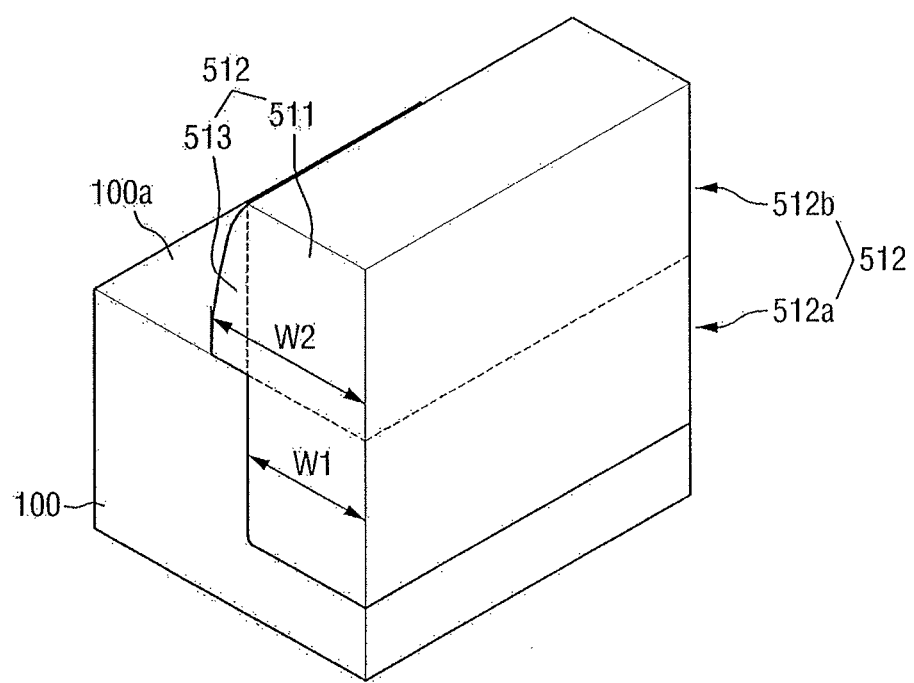

Referring to FIGS. 2 and 3, a second mask 512, which is different from the first mask 502, may be formed on the substrate 100. The second mask 512 may be made of a material that is different from that of the first mask 502. The second mask 512 may be made of, e.g., one or more of an oxide film, a nitride film, an oxynitride film, and a metal film. For example, if the first mask 502 is a nitride film, the second mask 512 may be an oxide film.

In detail, referring to FIG. 2, in a state where the first mask 502 is formed on the substrate 100, an insulating material is formed, e.g., deposited, to fill the trench 121, e.g., and to cover the first side wall 117. Then, a first insulating film 511 may be formed through planarization, so that an upper surface of the first mask 502 is exposed. Then, the first mask 502 is removed. For example, if the first mask 502 is a nitride film, it may be removed using phosphoric acid. Then, referring to FIG. 3, a second insulating film 513 of a spacer shape may be formed on a side wall of the first insulating film 511 that projects above an upper surface 100a of the substrate 100 to complete the second mask 512.

As shown herein, the second insulating film 513 has a spacer shape, but is not limited thereto. For example, the second insulating film 513 may include a first portion 512a that fills the trench 121 and a second portion 512b that projects above the upper surface 100a of the substrate 100. The first portion 512a refers to a portion of the first insulating film 511 that fills the trench 121, while the second portion 512b includes a portion of the first insulating film 511, which projects from the first portion 512a upward, and the second insulating film 513 with the spacer shape. A width W2 of the second portion 512b may be wider than a width W1 of the first portion 512a. This is because the second portion 512b includes the second insulating film 513 that is additionally formed, i.e., the second portion 512b extends laterally, e.g., along the X1 direction, beyond the first portion 512a to overlap both the first portion 512a and a part of the upper surface 100a of the substrate 100.

Figure 4:
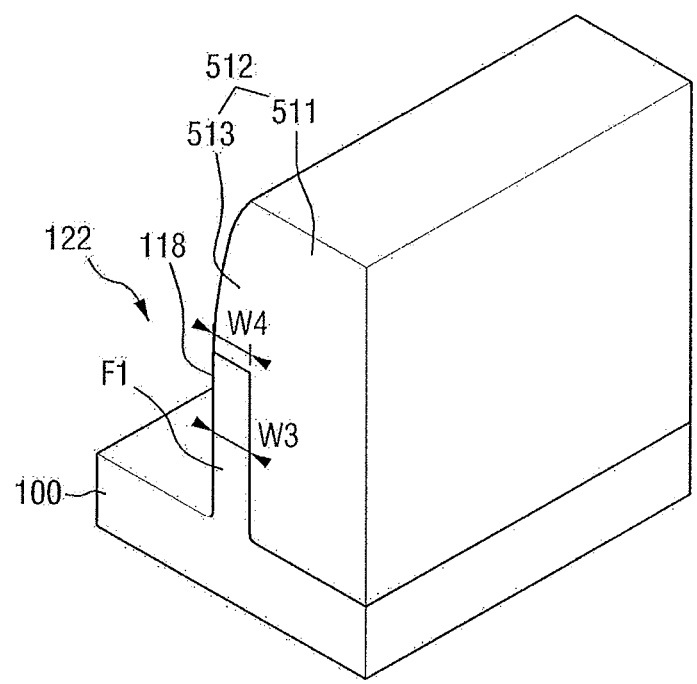

Referring to FIG. 4, a second side wall 118 of the fin F1 is formed by performing second etching of the substrate 100 using the second mask 512. That is, the fin F1 may be completed, while being partially covered by the second mask 512. The fin F1 may be shaped to extend along a second direction Y1 and a third direction Z1.

That is, a trench 122 may be formed in the substrate 100 by performing the second etching of the substrate 100. The second etching may be anisotropic etching, e.g., dry etching.

By adjusting the width of the second insulating film 513, e.g., a width W4 of the second insulating film 513 that covers the upper surface 100a of the substrate 100, the width of the fin F1 along direction X1 may be adjusted. That is, as illustrated, a width W3 of the fin F1 may be equal to the width W4 of the second insulating film 513 of the spacer shape. If the width W4 of the second insulating film 513 is widened, the width W3 of the fin F1 is widened, while, if the width W4 of the second insulating film 513 is narrowed, the width W3 of the fin F1 is narrowed.

Figure 5A:
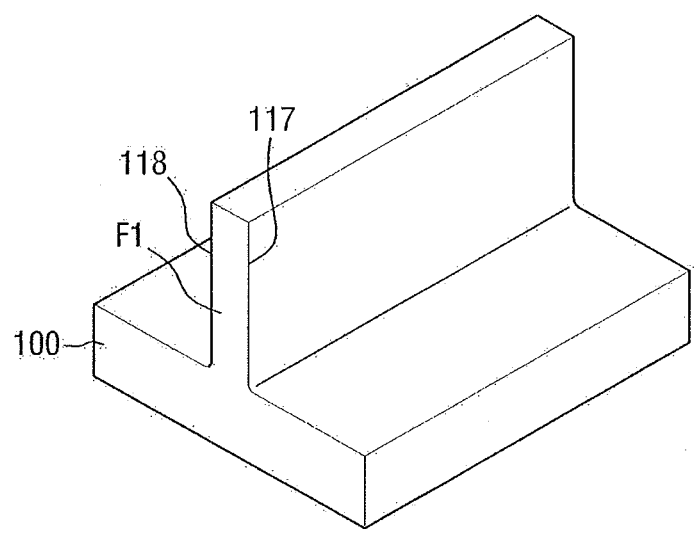

Referring to FIG. 5A, the second mask 512 is removed to exposed the first and second side walls 117 and 118 of the fin F1. By way of summary and review of the procedure illustrated in FIGS. 1 to 5A, the first side wall 117 and the second side wall 118 of the fin F1 are formed by separate etching processes. By forming the fin F1 via separate etching processes, i.e., by etching twice as described above, it is possible to implement the fin F1 with a high aspect ratio. If the fin is formed by performing an etching process once, it may be difficult to form a fin with a very narrow width (e.g., a fin having a width of about 20 nm to about 30 nm) due to erosion of a hard mask that is used in the etching process. This is because a hard mask with a very narrow width is rapidly eroded due to a lateral etching effect.

However, in the method for fabricating the semiconductor device according to an embodiment, since the first side wall 117 and the second side wall 118 of the fin F1 are formed through separate etching processes, the first mask 502 and the second mask 512 are sufficiently thick, and thus the first mask 502 and the second mask 512 are not easily eroded. Accordingly, the fin F1 has a very narrow width, e.g., a width of about 20 nm to about 30 nm, by a simplified process.

For example, a first shape of the first side wall 117 and a second shape of the second side wall 118 may be different from each other. This is because the first side wall 117 and the second side wall 118 are formed through different etching processes. For example, a first slope of the first side wall 117 and a second slope of the second side wall 118 may be different from each other.

Figure 5B:
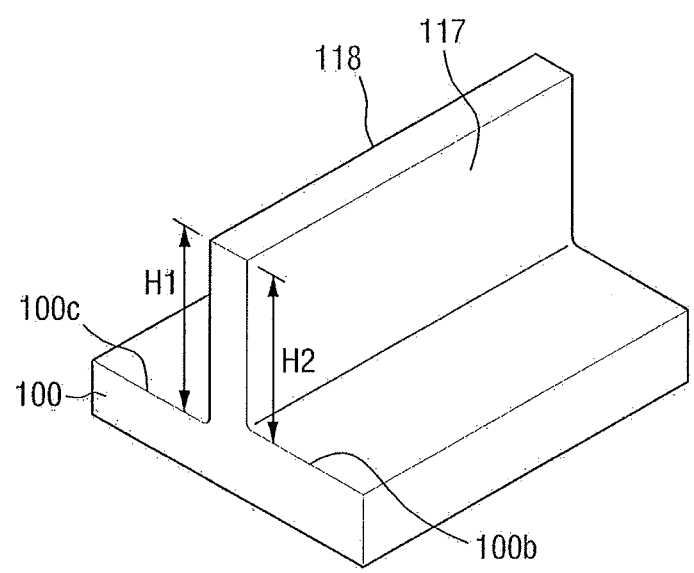

Further, as illustrated in FIG. 5B, a first bottom surface 100b of the substrate 100 may be connected to the first side wall 117, and a second bottom surface 100c of the substrate 100 may be connected to the second side wall 118. A first height H1 of the first side wall 117, which is measured from the first bottom surface 100b, may be different from a second height 142 of the second side wall 118, which is measured from the second bottom surface 100c.

Figure 5C:
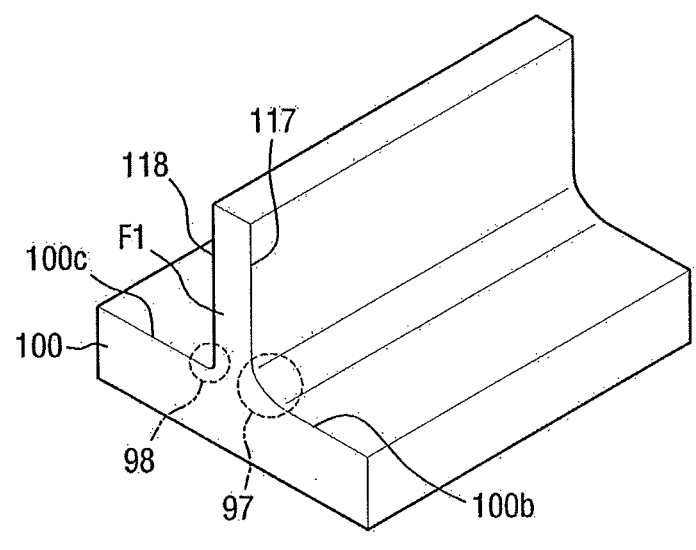

Further, as illustrated in FIG. 5C, a connection shape 97 between the first bottom surface 100b and the first side wall 117 may be different from a connection shape 98 between the second bottom surface 100c and the second side wall 118. For example, the first bottom surface 100b and the first side wall 117 may be connected at a gentle angle, and the second bottom surface 100c and the second side wall 118 may be connected at a steep angle. However, the connection shapes are not limited thereto.

Figure 6:
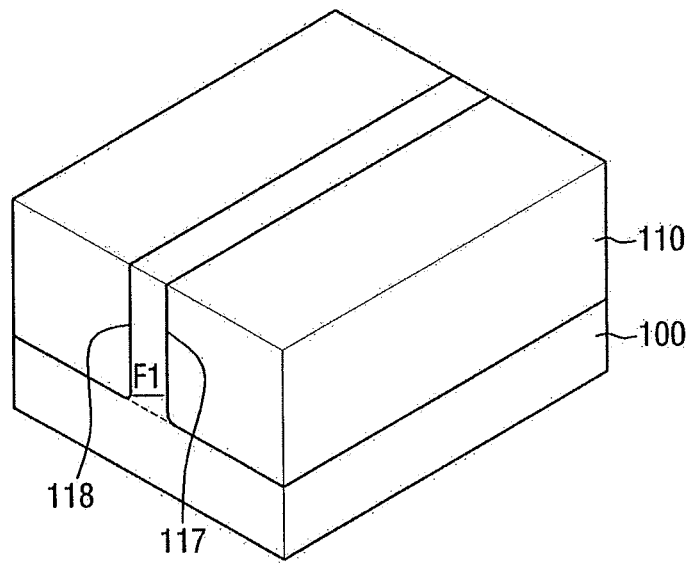
Figure 6:
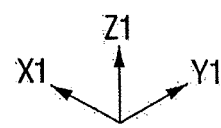

Next, referring to FIG. 6, an isolation film 100 may be formed to fill the trench 121. The isolation film 110 may be formed of a material that includes at least one of silicon oxide, silicon nitride, and silicon oxynitride.

Figure 7:
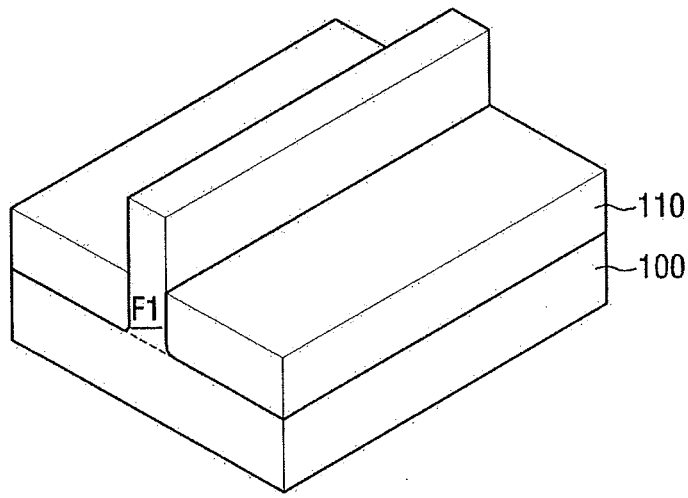
Figure 7:
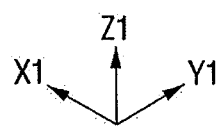

For example, referring to FIG. 7, an upper portion of the fin F1 may be exposed through recessing an upper portion of the isolation film 110. The recessing process may include a selective etching process.

In another example, a part of the fin F1 that projects above the isolation film 110 may be formed by an epi process. In detail, after the isolation film 110 is formed, a part of the fin F1 may be formed through performing the epi process, in which the upper surface of the fin F1 that is exposed by the isolation film 110 is processed as a seed, without the recessing process.

Further, doping for adjustment of a threshold voltage may be performed with respect to the fin F1. If the fin transistor is an NMOS transistor, the impurity may be boron (B). If the fin transistor is a PMOS transistor, the impurity may be phosphorous (P) or arsenic (As).

Figure 8:
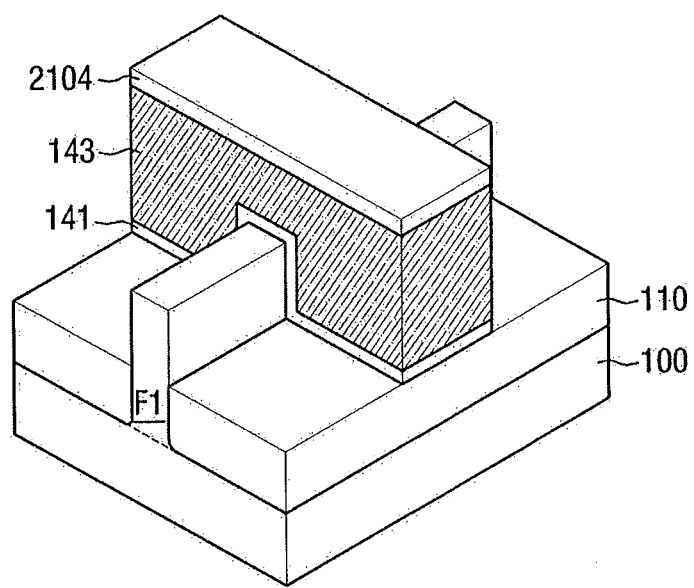

Referring to FIG. 8, a dummy gate insulating film 141 and a dummy gate electrode 143, which extend in a first direction X1 to cross the fin F1, may be formed by performing an etching process using a mask pattern 2104. For example, the dummy gate insulating film 141 may be a silicon oxide film, and the dummy gate electrode 143 may be made of poly silicon.

Figure 9:
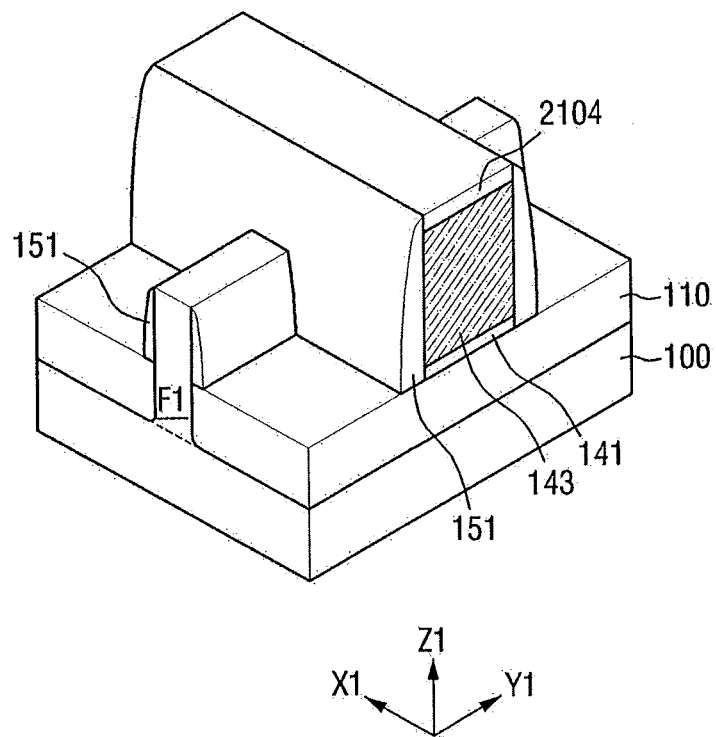

Referring to FIG. 9, a first spacer 151 may be formed on a side wall of the dummy gate electrode 143 and on a side wall of the fin F1. For example, after an insulating film is formed on the resultant material, on which the dummy gate electrode 143 is formed, the first spacer 151 may be formed by performing an etch back process. The first spacer 151 may expose an upper surface of the mask pattern 2104 and the upper surface of the fin F1. The first spacer 151 may be a silicon nitride film or a silicon oxynitride film.

Figure 10:
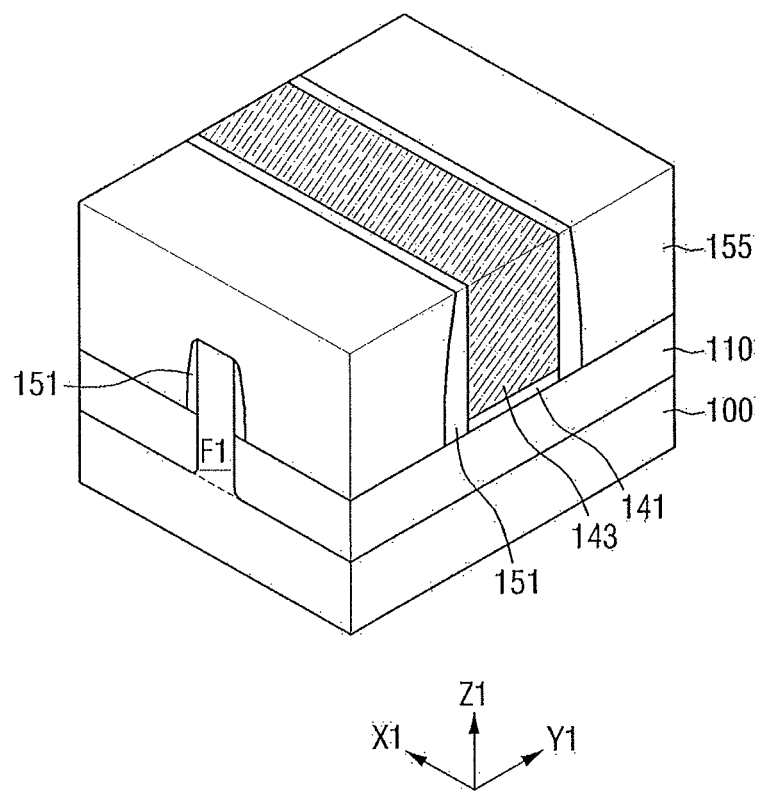

Referring to FIG. 10, an interlayer insulating film 155 may be formed on the resultant material, on which the first spacer 151 is formed. The interlayer insulating film 155 may be a silicon oxide film.

Then, the interlayer insulating film 155 may be planarized until the upper surface of the dummy gate electrode 143 is exposed. As a result, the mask pattern 2104 is removed, and the upper surface of the dummy gate electrode 143 is exposed.

Figure 11:
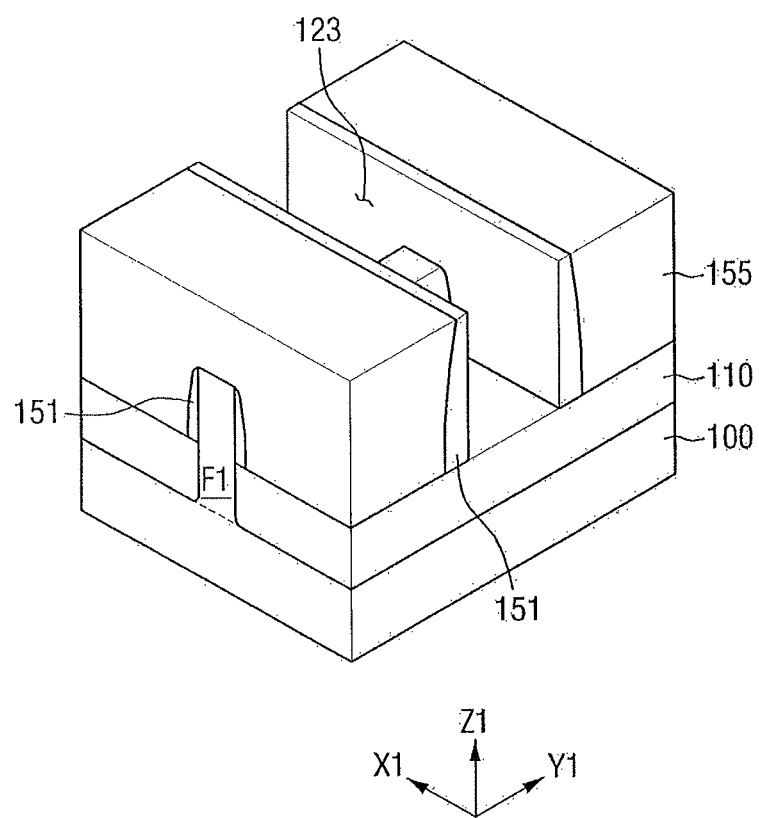

Referring to FIG. 11, the dummy gate insulating film 141 and the dummy gate electrode 143 are removed. As the dummy gate insulating film 141 and the dummy gate electrode 143 are removed, a trench 123 that exposes the isolation film 110 is formed.

Referring to FIGS. 12 to 14, a gate insulating film 145 and a gate electrode 147 are formed in the trench 123.

The gate insulating film 145 may include a high-k material having a higher dielectric constant than that of a silicon oxide film. For example, the gate insulating film 145 may include $HfO_2$, $ZrO_2$, and/or $Ta_2O_5$. The gate insulating film 145 may be substantially conformally formed along the side wall and the lower surface of the trench 123.

The gate electrode 147 may include metal layers MG1 and MG2. As illustrated in FIGS. 12-14, the gate electrode 147 may include two or more stacked metal layers MG1 and MG2. The first metal layer MG1 serves to adjust a work function, and the second metal layer MG2 serves to fill a space that is formed by the first metal layer MG1. For example, the first metal layer MG1 may include at least one of TiN, TaN, TiC, and TaC. For example, the second metal layer MG2 may include W or Al. However, embodiments are not limited to the described above and the gate electrode 147 may be made of Si or SiGe, rather than metal.

Referring to FIGS. 15 to 17, a recess 125 is formed in the fin F1 on both sides of the gate electrode 147.

The recess 125 may be formed in the fin F1 on both sides of the gate electrode 147. A side wall of the recess 125 is inclined, and the recess 125 is shaped to be widened as it goes away from the substrate 100. As illustrated in FIG. 15, the width of the recess 125 along the X1 direction may be wider than the width of the fin F1 along the X1 direction.

Referring to FIGS. 18 to 20, a source/drain 161 is formed in the recess 125. For example, the source/drain 161 may be in the shape of an elevated source/drain. That is, an upper surface of the source/drain 161 may be higher than a lower surface of the interlayer insulating film 155.

For example, if the fin transistor 101 is a PMOS transistor, the source/drain 161 may include a compressive stress material. For example, the compressive stress material may be a material having a large lattice constant in comparison to Si, e.g., the compressive stress material may be SiGe. The compressive stress material may improve mobility of carriers in a channel region by applying compressive stress to the fin F1.

In another example, if the fin transistor 101 is an NMOS transistor, the source/drain 161 may be the same material as the substrate 100 or a tensile stress material. For example, if the substrate 100 is made of Si, the source/drain 161 may be Si, or a material having a smaller lattice constant than that of Si, e.g., e.g., SiC.

Further, the source/drain 161 may be formed by an epi process. Further, depending on whether the fin transistor 101 is a PMOS or NMOS transistor, the material of the source/drain 161 may differ. Further, if needed, impurities may be in-situ doped in the epi process.

Figure 21:
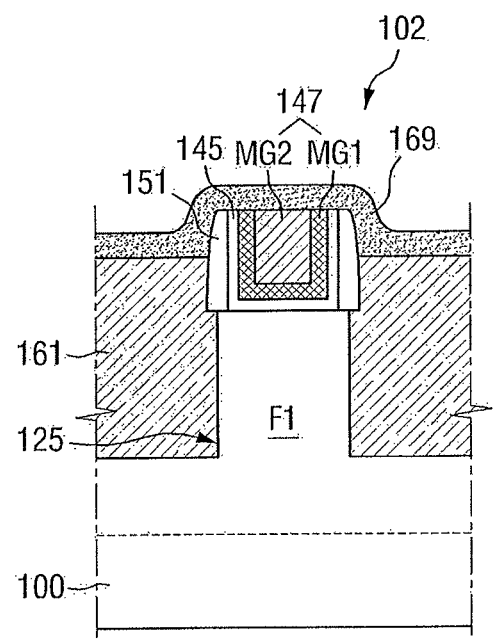
FIG. 21 illustrates a stage in a method for fabricating a semiconductor device according to another embodiment.

FIG. 21 illustrates a view of an intermediate stage explaining a method for fabricating a semiconductor device according to another embodiment. The stages as illustrated in FIGS. 1 to 20 may be the same as those in the method for fabricating a semiconductor device according to the embodiment of FIG. 21. After the stage of FIG. 20, as illustrated in FIG. 21, a stress film 169 may be formed on the fin transistor 102.

The stress film 169 may be, e.g., a SiN film. Whether the SiN film provides a tensile stress or a compressive stress is determined according to a ratio of N—H bonding to Si—H bonding in the SiN film. For example, if the ratio of N—H bonding to Si—H bonding is about 1 to 5, the SiN film may provide a tensile stress, whereas, if the ratio of N—H bonding to Si—H bonding is about 5 to 20, the SiN film may provide a compressive stress. By adjusting the stress using the stress film 169, the amount of current of the fin transistor 102 may be adjusted.

FIGS. 22 to 27 illustrate views of intermediate stages explaining a method for fabricating a semiconductor device according to still another embodiment. Explanation of portions that are substantially the same as the portions explained using FIGS. 1 to 20 will be omitted. The fabricating method of FIGS. 1 to 20 refers to a method for fabricating a fin transistor, while the fabricating method of FIGS. 22 to 27 refers to a method for fabricating a gate all around transistor 103.

Figure 22:
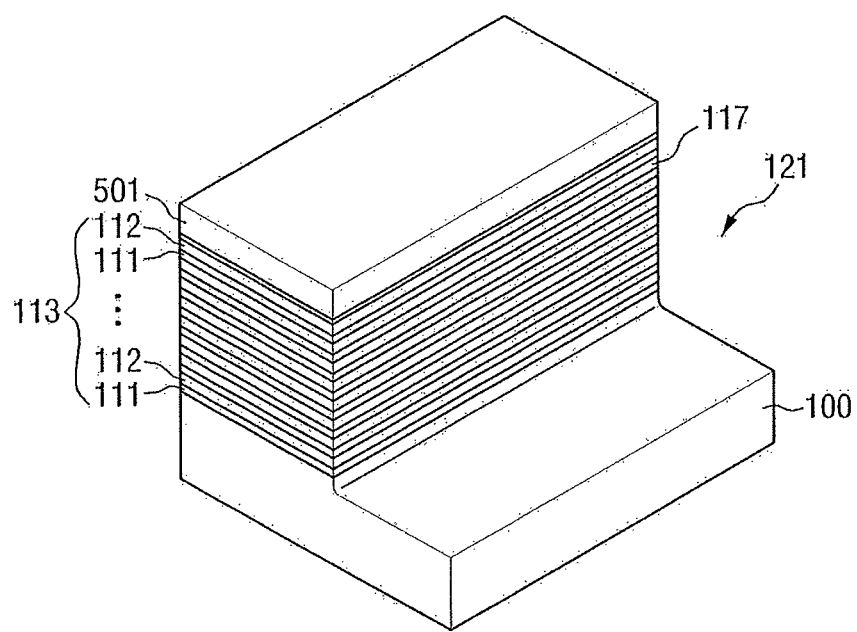
FIGS. 22 to 27 illustrate stages in a method for fabricating a semiconductor device according to still another embodiment.

Referring to FIG. 22, a structure 113, in which semiconductor layers 112 and sacrificial layers 111 are stacked alternately and repeatedly, may be formed on the substrate 100. The semiconductor layer 112 may be made of Si and the sacrificial layer 111 may be made of SiGe, but are not limited thereto. The number of alternate repetitions of the semiconductor layers 112 and the sacrificial layers 111 may differ depending on the number of nanowires (see 110 in FIG. 26) to be formed thereafter.

Then, a first mask 501 may be formed on the structure 113. The first mask 501 may be made of, e.g., one or more of an oxide film, a nitride film, an oxynitride film, and a metal film. Then, the first side wall 117 of a fin (F2 in FIG. 25) is formed by performing first etching of the structure 113. That is, a trench 121 may be formed in the substrate 100 by performing the first etching of the substrate 100.

Figure 23:
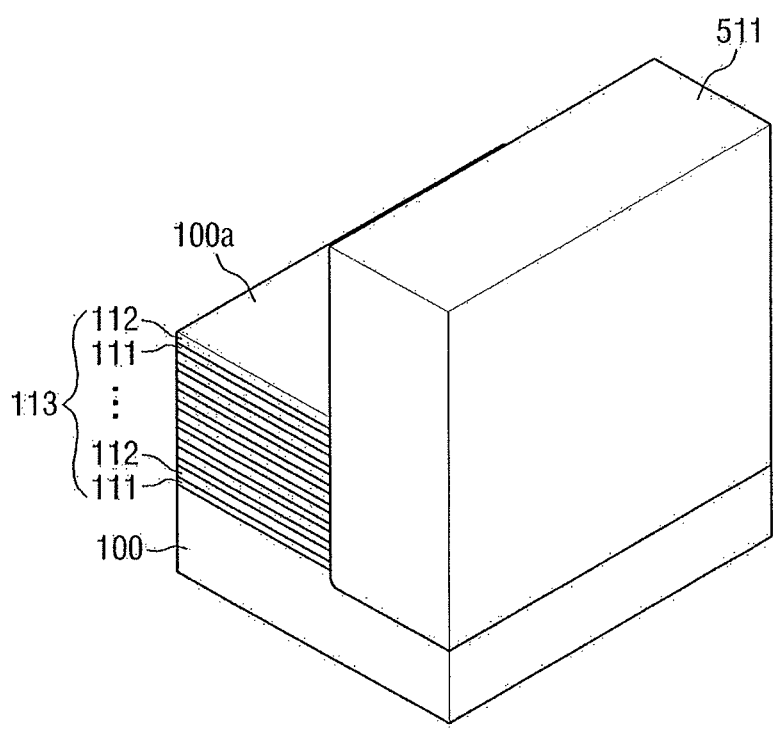
Figure 24:
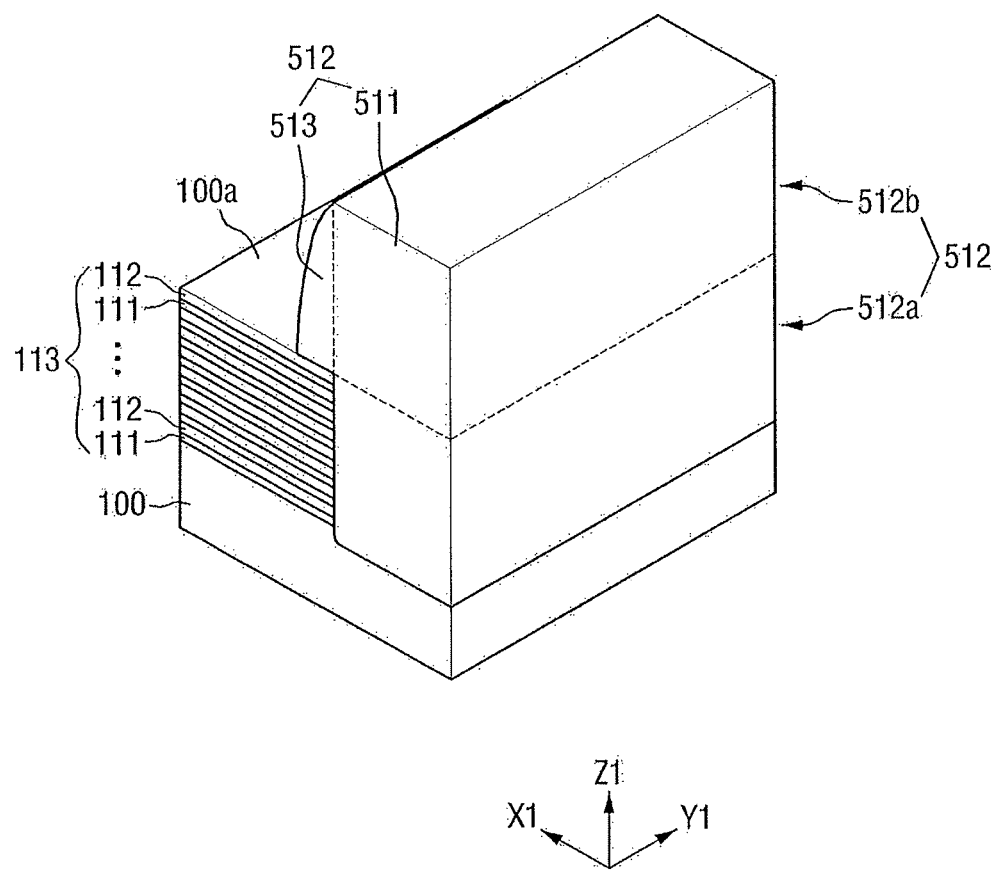

Referring to FIGS. 23 and 24, a second mask 512 may be formed on the structure 113. The second mask 512 may be made of a material that is different from that of the first mask 501. For example, if the first mask 501 is a nitride film, the second mask 512 may be an oxide film.

As described above, and as shown in FIG. 23, in a state where the first mask 501 is formed on the substrate 100, an insulating material is formed enough to fill the trench 121. Then, the first insulating film 511 is formed through planarization so that an upper surface of the first mask 501 is exposed. Then, the first mask 501 is removed. For example, if the first mask 501 is a nitride film, it may be removed using phosphoric acid. Then, referring to FIG. 24, the second insulating film 513 of a spacer shape is formed on a side wall of the first insulating film 511 that projects above the upper surface 100a of the substrate 100 to complete the second mask 512. Therefore, the second insulating film 513 is in a spacer shape, but is not limited thereto.

Figure 25:
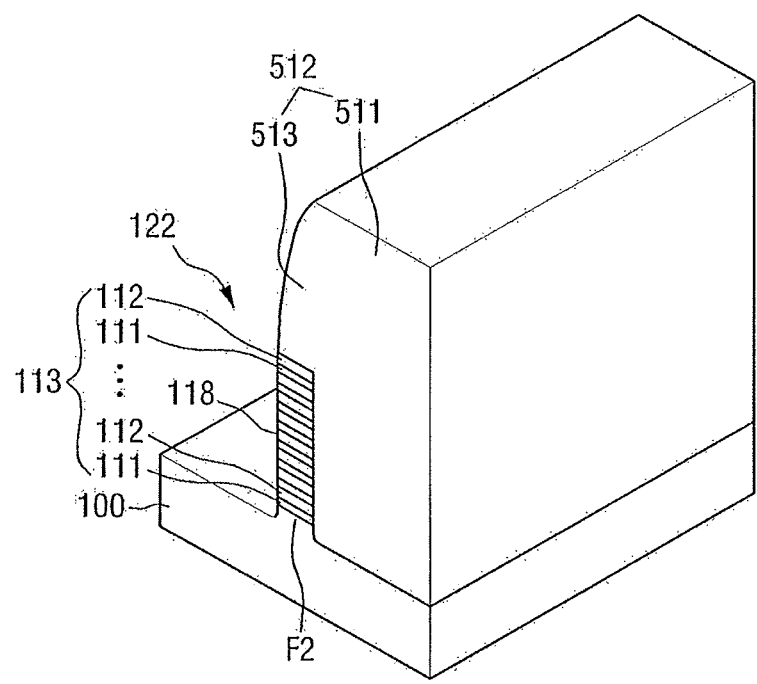

Referring to FIG. 25, the second side wall 118 of the fin F2 is formed by performing second etching of the structure 113. That is, the fin F2 is completed. The fin F2 may be shaped to extend in a second direction Y1 and to project in a third direction Z1.

Figure 26:
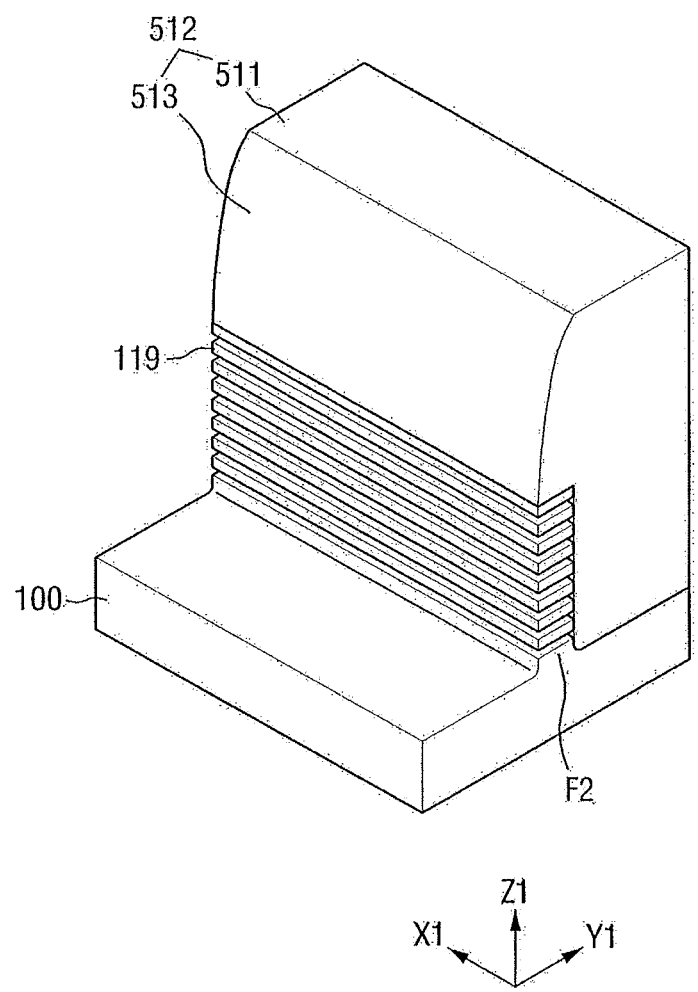

Referring to FIG. 26, the sacrificial layers 111 of the structure 113 are removed, and a plurality of semiconductor layers 112, which are stacked to be spaced apart from each other, remain. Here, the remaining semiconductor layers 112 correspond to nanowires 119. That is, the semiconductor layers 112 correspond to the channel region of the gate all around transistor.

Here, the sacrificial layers 111 may be removed using chemical dry etching. For example, by combining $CF_4$ gas, $O_2$ gas, and $N_2$ gas and properly adjusting pressure and temperature, the etching rate of the sacrificial layer 111 (i.e., SiGe) to the semiconductor layer 112 (i.e., Si) can be heightened.

Further, when the sacrificial layers 111 are removed, the second mask 512 supports the plurality of remaining semiconductor layers 112 (i.e., nanowires 119). Accordingly, the nanowires 119 in thin long shapes are not damaged during the process. That is, stability of the process of fabricating nanowires 119 can be heightened.

Figure 27:
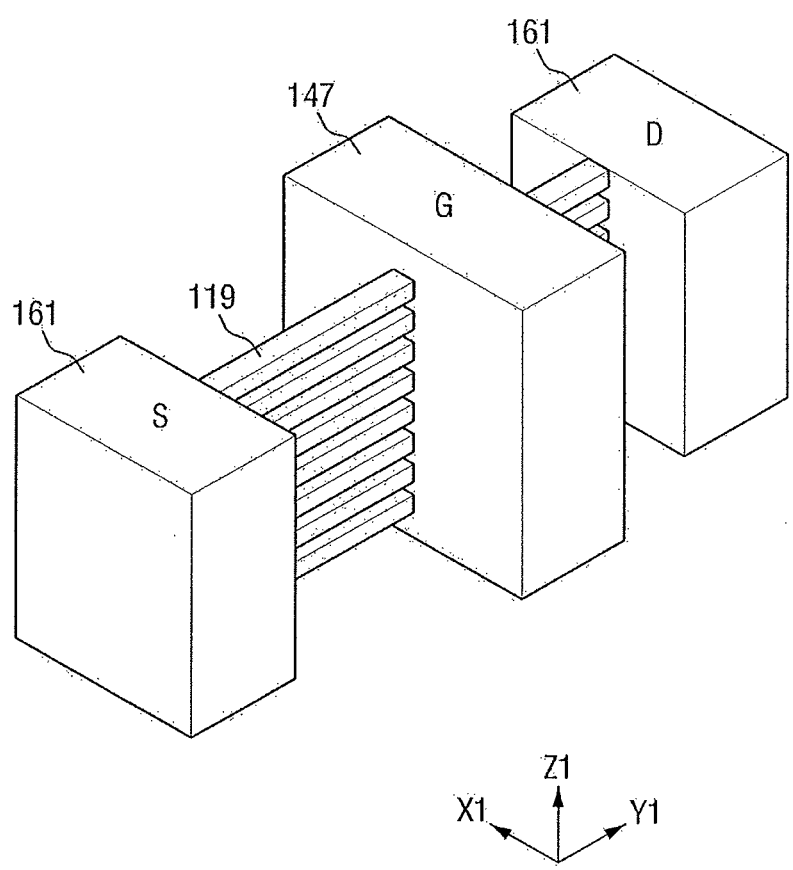

Referring to FIG. 27, the second mask 512 is removed. In FIG. 27, the source/drain 161 that is connected to the nanowires 119 is also illustrated. Then, a gate 147 is formed to cross the nanowires 119. As illustrated, the gate 147 may be formed to surround the nanowires 119.

Figure 28:
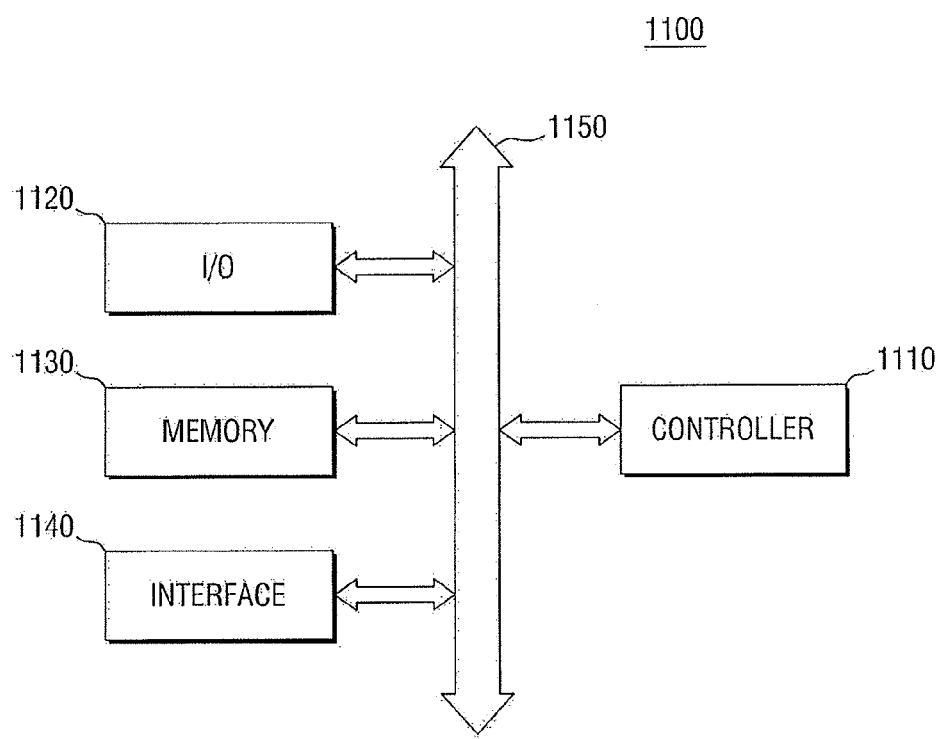
FIG. 28 illustrates a block diagram of an electronic system including a semiconductor device according to some embodiments.

FIG. 28 illustrates a block diagram of an electronic system including a semiconductor device according to some embodiments.

Referring to FIG. 28, an electronic system 1100 according to an embodiment may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include, e.g., at least one of a microprocessor, a digital signal processor, a microcontroller, and logic elements that can perform similar functions. The I/O device 1120 may include, e.g., a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. A fin field-effect transistor according to embodiments may be provided inside the memory 1130 or may be provided as a part of the controller 1110 and the I/O device 1120.

The electronic system 1100 may be applied, e.g., to a PDA (Personal Digital Assistant), a portable computer, a web tablet, a wireless phone, a mobile phone, a digital music player, a memory card, or all electronic devices that can transmit and/or receive information in wireless environments.

Figure 29:
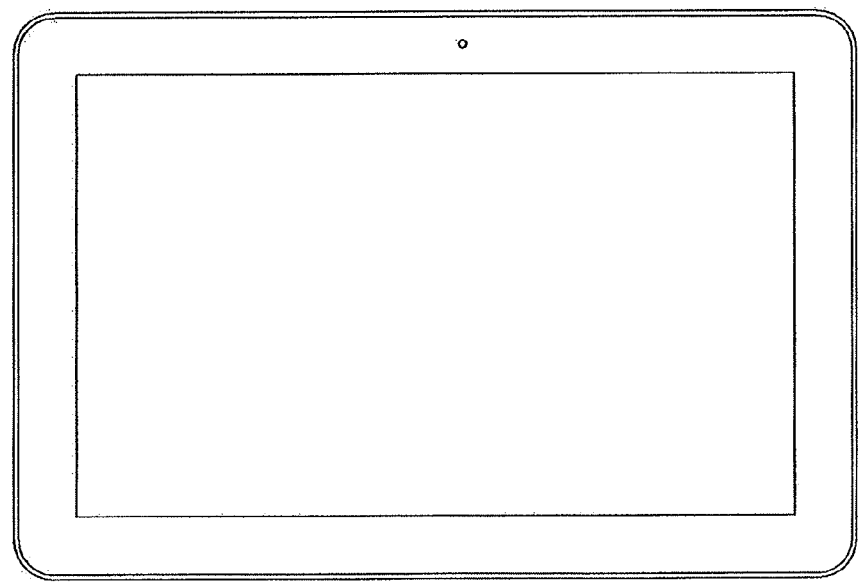
FIGS. 29 and 30 illustrate exemplary views of a semiconductor system to which a semiconductor device according to some embodiments can be applied.
Figure 30:
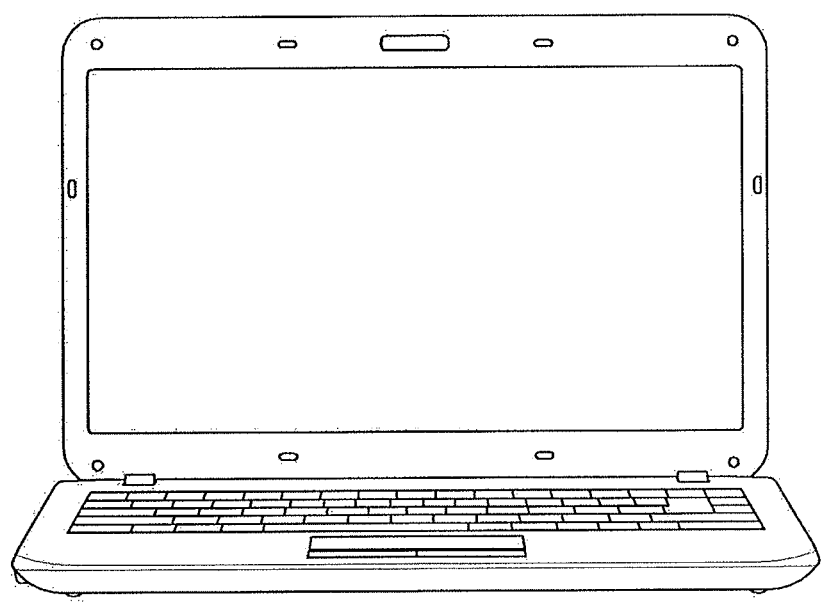

FIGS. 29 and 30 illustrate exemplary views of a semiconductor system to which the semiconductor device according to some embodiments can be applied. FIG. 29 illustrates a tablet PC, and FIG. 30 illustrates a notebook PC. At least one of the semiconductor devices 101, 102, and 103 according to embodiments may be used in the tablet PC or the notebook PC. It is apparent to those of skilled in the art that the semiconductor device according to some embodiments of the present inventive concept can be applied even to other integrated circuit devices that have not been exemplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
    forming a structure on a substrate, the structure including alternately and repeatedly stacked semiconductor layers and sacrificial layers;
    forming a first mask on the structure;
    forming a first side wall of a fin by performing a first etching of the structure using the first mask;
    forming a second mask different from the first mask on the structure, the first mask being removed from the substrate after partially forming the second mask; and
    forming a second side wall of the fin by performing a second etching of the structure using the second mask.

2. The method for fabricating a semiconductor device as claimed in claim 1, further comprising removing the sacrificial layers of the structure, after forming the second side wall of the fin, such that a plurality of stacked and spaced apart semiconductor layers remain in the structure.

3. The method for fabricating a semiconductor device as claimed in claim 2, further comprising removing the second mask, after defining the plurality of stacked and spaced apart semiconductor layers.

4. The method for fabricating a semiconductor device as claimed in claim 1, wherein the semiconductor layers include Si, and the sacrificial layers include SiGe.

5. A method for fabricating a semiconductor device, the method comprising:
    forming a structure on a substrate, such that the structure includes alternately and repeatedly stacked semiconductor layers and sacrificial layers;
    forming a first mask on the structure;
    forming a first side wall of a fin by performing a first etching of the structure using the first mask;
    forming a second mask different from the first mask on the structure, the first mask remaining on the structure during at least partial formation of the second mask
    forming a second side wall of the fin by performing a second etching of the structure using the second mask;
    removing the sacrificial layers of the structure, such that a plurality of stacked semiconductor layers remains and is spaced apart from each other in the structure; and
    removing the second mask.

6. The method for fabricating a semiconductor device as claimed in claim 5, wherein:
    performing the first etching of the substrate includes forming a trench in the structure and
    forming the second mask includes forming a first portion that fills the trench and forming a second portion that projects above an upper surface of the structure.

7. The method for fabricating a semiconductor device as claimed in claim 6, wherein forming the second mask includes forming a width of the second portion wider than a width of the first portion.

8. The method for fabricating a semiconductor device as claimed in claim 6, wherein forming the second mask includes forming a side wall of the second portion in a spacer shape, a width of the spacer shape being equal to a width of the fin.

9. The method for fabricating a semiconductor device as claimed in claim 5, wherein the semiconductor layer is made of Si, and the sacrificial layer is made of SiGe.

10. The method for fabricating a semiconductor device as claimed in claim 5, wherein:
    the first side wall of the fin includes side walls of the alternately and repeatedly stacked semiconductor layers and sacrificial layers, and
    the second mask is adjacent to the side walls of the alternately and repeatedly stacked semiconductor layers and sacrificial layers.

* * * * *